(12) United States Patent
Arnold et al.

(10) Patent No.: US 6,335,226 B1
(45) Date of Patent: Jan. 1, 2002

(54) DIGITAL SIGNAL PROCESSOR/KNOWN GOOD DIE PACKAGING USING REROUTED EXISTING PACKAGE FOR TEST AND BURN-IN CARRIERS

(75) Inventors: Richard W. Arnold, McKinney; Lester L. Wilson, Sherman; Mahmood A. Siddiqui, Desoto, all of TX (US); James A. Forster, Barrington, RI (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/500,507

(22) Filed: Feb. 9, 2000

(51) Int. Cl.[7] .................. H01L 21/30; H01L 21/44; H01L 23/48
(52) U.S. Cl. ............... 438/123; 438/108; 438/118; 438/456; 438/611; 257/734; 257/737; 257/784
(58) Field of Search ............... 438/14, 17, 18, 438/55, 64, 121, 15, 611, 612, 613, 108, 118, 119, 123–126, 614, 615, 616, 617, 106, 456; 257/734–735, 737, 778, 784, 786, 708

(56) References Cited

U.S. PATENT DOCUMENTS

| | | | | |
|---|---|---|---|---|
| 3,745,422 A | * | 7/1973 | Carnes | 257/708 |
| 5,783,464 A | * | 7/1998 | Burns | 438/112 |
| 5,837,562 A | * | 11/1998 | Cho | 438/51 |
| 5,913,134 A | * | 6/1999 | Drayton et al. | 438/456 |
| 6,001,673 A | * | 12/1999 | Marcinkiewicz | 438/128 |
| 6,114,221 A | * | 9/2000 | Tonti et al. | 438/455 |
| 6,130,141 A | * | 10/2000 | Degani et al. | 438/455 |
| 6,232,150 B1 | * | 5/2001 | Lin et al. | 438/119 |

* cited by examiner

Primary Examiner—Matthew Smith
Assistant Examiner—Chuong Luu
(74) Attorney, Agent, or Firm—Wade James Brady III; Frederick J. Telecky, Jr.

(57) ABSTRACT

A package for a semiconductor die having a header with a cavity. The cavity includes a floor, sidewalls and a plurality of vertically spaced apart rows along the cavity sidewalls, each row including a plurality of spaced apart bond fingers. An electrically insulating membrane, preferably silicon, is disposed over the floor of the cavity, the membrane including a plurality of bumps, a plurality of peripherally located membrane bond pads and an interconnect from each of the bumps to a membrane bond pad. Bond wires are connected between the membrane bond pads and the bond fingers on the plurality of rows. A semiconductor die is provided having a plurality of bond pads, each bond pad contacting one of the bumps on the membrane. The header includes a plurality of alternating layers of electrically conducting material and electrically insulating material, the bond fingers on the header each being coupled to one of the layers of electrically conducting material. Each layer of electrically conducting material can include a plurality of spaced apart interconnect lines, each line coupled to one of the bond fingers. The package can include an electrical conductor interconnecting the electrically conducting material on spaced apart layers of the header.

12 Claims, 3 Drawing Sheets

DIGITAL SIGNAL PROCESSOR/KNOWN GOOD DIE PACKAGING USING REROUTED EXISTING PACKAGE FOR TEST AND BURN-IN CARRIERS

CROSS REFERENCE TO RELATED APPLICATIONS

This application is related to Ser. No. 09/164,580, Ser. No. 09/500,519 and Ser. No. 09/431,730, the contents of all of which are incorporated herein by reference.

FIELD OF THE INVENTION

This invention relates to a structure and procedure for providing a reusable package for use in conjunction with testing and burn-in for a digital signal processor (DSP) known good die (KGD).

BACKGROUND AND BRIEF DESCRIPTION OF THE PRIOR ART

The typical semiconductor device progresses through a life cycle toward a maturity where environmental screens, such as temperature testing and burn-in are ultimately not required. During the early phases of the device life-cycle, however, burn-in and temperature testing are required to deliver the quality and reliability of product necessary for the customer. In early life, if devices are to be delivered as KGD, these devices must also receive temperature testing and burn-in.

Presently, one of the greatest costs associated with die level KGD test and burn in carriers is the cost of design and redesign of the test carrier. Initially, the KGD test carrier must be designed so that the test contacts are correctly matched to the bond pads of the integrated circuit for electrical connection to the device. The inputs and outputs from the device will proceed through the KGD carrier contacts. The test carrier contacts are connected to metal leads that carry the electrical signals to the edge of the carrier where there are connections that interface with a test socket or burn-in socket. The trace of the metal lead that carries this signal is one of the important design concerns in the electrical performance of the test carrier. The initial design of the test carrier is quite large. The initial design also requires a tooling set to build the patterns associated with the carrier. The cost of a tooling set for a test carrier is also quite large.

If the integrated circuit then goes through a redesign to enhance the performance of the device, the test carrier must be redesigned and the tooling must be rebuilt. The redesign of the integrated circuit is a common occurrence, especially during the early life of the device. Integrated circuits average in early life a redesign about every three months. If the device has problems such as yield during fabrication or electrical performance, then a redesign can occur much more frequently. Each redesign has an associated design and tooling charge associated therewith.

The typical cycle for design and fabrication of a KGD test carrier is about six weeks. The design of the test carrier cannot occur until the final lay out of the integrated circuit is known. This cycle time is therefore added into the delivery schedule of the KGD product.

This limits the growth of the KGD business to supporting mature products that only require test screens, used to make quality and reliability levels equivalent to burned in parts, at probe or hot chuck probe. It is apparent that if a low cost method of screening the leading edge DSP product could be developed with burn-in and temperature test, then these early life DSP products could also be offered as KGD and thereby provide a significant economic advantage to the manufacturer. It is also apparent that the test carrier metal traces and leads could be easily reconfigured to adapt to the cycles of design and redesign that are associated with the integrated circuit, then significant cost and cycle time could be removed from the time required for fabrication of KGD carriers.

One option for temperature test and burn-in is to use high pin count test carriers. The established temporary test carriers generally operate below 280 pins. A temporary test carrier for leading edge DSP devices has yet to be developed and those contemplated have several technical problems that limit the development and scalability from low to high volume applications. Costs related to building special assembly techniques, unique test and burn-in infrastructure and unique unload to package for KGD are high. The line requires a separate assembly, test and burn-in infrastructure to support the production of KGD using the prior art techniques. Each step of the process is costly because the line has to separate engineering development and eventual product development.

In addition, there is generally a great deal of risk associated with developing a separate line to support carriers for KGD because the device is generally in the early life cycle and the customer requirements are often not firm. Another example is where the die reaches maturity and no longer requires the carrier technology before the required delivery.

SUMMARY OF THE INVENTION

The present invention solves three of the fundamental problems of KGD productization. First, the invention allows entry into the KGD market during the early phases of the DSP product life-cycle when temperature test and burn-in are still required. Second, the solution is a viable technical solution to burn-in and temperature test of KGD versus the proposed solutions of high pin count test carriers. The failures related to the development of the Die Mate, high cost and poor performance, amplify this need. Third, the costs involved using the present solution are much less and thus the financial risk associated with developing KGD in early life of a DSP is much more attractive.

A solution to providing DSP/KGD is to take the existing ceramic package or its equivalent in other materials, such as, for example, standard plastic packaging, and reroute the signal lines in the header, package or chip carrier base so that a special substrate can be mounted in the header to contact the die by the die bonding pads with the resulting signals from the DSP/KGD package thereby being able to match the header bond fingers existing in the header. The special substrate mounted within the package serves as a testing interface for the die product. The substrate is bonded to the package in much the same manner that a die product is bonded to the header post with aluminum bond wire. The substrate has conductive bumps which connect to the aluminum bond pads on the DSP die or the flip chip bumps. The substrate is also connected to a bonding surface that connects the substrate to the rerouted header. The conductive bumps conduct the signals to and from the device under test (DUT). The DSP device is mounted atop the bumps on the substrate bumps, similar in configuration to the procedure used in standard KGD carriers. The DSP is held in place by a spring load as is presently used in the prior art or by the temporary lid and compliant material used in the standard KGD carrier. The bumps upon the substrate can be either conductive polymer, such as, for example, as manufactured by EPI, compliant bumps, such as, for example, as manufactured by DTO or hard nickel-plated bumps, such as, for example, as manufactured by MMS. Other types of conductive bumps could serve as well.

The cost associated with this KGD system in accordance with the present invention is the cost associated with retooling the ceramic or equivalent header and the cost to build the substrates for electrical interconnection between the die and the header. This solves the problems previously presented to the DSP/KGD program by making available a test carrier with established electrical characteristics that fits into the existing package flow as, for example, the pin arrangement changes and/or the pin arrangement and number remains the same but the chip and bond pad locations thereon are shrunk or enlarged, generally the former, thereby making the header reusable.

The DSP/KGD solution of the present invention differs from the KGD carrier solutions in that, first, it utilizes the principle of maintaining the electrical test and burn-in infrastructure that is already in place for the DSP product line. This means that a new product can be provided and subjected to burn-in and the test on a single package that can use DSP/KGD and the KGD can be produced along with the package product for the same process flow and pin configuration. The KGD that result can be used for several options that can leverage the backend structure. These options include (a) a KGD die bank for customers to draw upon, (b) multichip module (MCM) die product, (c) KGD to be used for other more expensive packages that require a high yield die, and (d) KGD to be shipped directly to customers. The use of a single package qualification results in a much lower cost for KGD electrical and test infrastructure. Furthermore, the DSP/KGD solution is scaleable from low to high volume lines. This solution can be used for a low cost manually loaded die into the package. It can also be loaded by an automated assembly line that uses load and unload equipment set up prior art style carriers and then proceeds through the same test and burn-in lines. The low cost at each end of the spectrum makes the DSP/KGD attractive to the broad range of production requirements for KGD.

A further solution to the problem is to fabricate a special membrane that can be easily adapted to the design and change cycles of the integrated circuit. Such a membrane is composed of thin traces of metal lines that cross one another forming a criss-cross pattern upon the substrate material that is to be used for the base of the KGD test carrier. The metal is deposited upon a substrate such as, for example, a silicon wafer, ceramic, or polymer material that will fit into the test carrier. The metal can be any one or more of a plurality of electrical conductors such as, for example, aluminum, gold, silver or copper. The metal is coated onto the substrate. To form the criss-crossed structure for the test carrier membrane, the substrate is processed through a lithography and etching operation of standard type or other available technology to set the pattern in as tight or narrow a structure as required for the appropriate test contact pitches.

Once the test carrier membrane has been fabricated, it can be set up for the tooling process. The coordinates and types of signals upon the integrated circuit bonding pads and the size of the integrated circuit die product are known in advance. The design of the membrane is set so that it is a mirror image of the bond pads of integrated circuit die. The traces from the interconnecting bump on the membrane connected to the bond pads on the die are routed to a bonding pad on the membrane for interconnection to the KGD test carrier leads. The design parameters are fed into the electrically controlled laser system which then cuts the criss-crossed metal leads into the pattern that has been fed to the laser system by the operator. After the leads are formed, the bumped interconnection is placed on the inner lead terminal which is the interconnection to the bond pads of the integrated circuit. This interconnection can be of the type set forth in Ser. No. 09/431,730, the contents of which are incorporated herein by reference or a screened on conductive polymer bump. The location of the bump is programmed into the automated stud bump bonder. The conductive polymer location is defined by the screening mask. The die carrier membrane is then sawed on its sides and removed from the remainder of the substrates.

The completed test carrier membrane is then taken and mounted into the KGD test carrier which can be any one of the test carriers set forth in the above identified copending applications. Once mounted within the test carrier, the test carrier membrane is wire bonded to the test carrier to interconnect the bumped terminal to the test carrier leads. The test carrier then goes through its normal assembly process which will place a spring held lid upon the backside surface of the integrated circuit die product to be tested.

The cost of the redesign is at a minimum because the membrane only requires software parameters for the laser to etch a new pattern therein. The formation of the bumps is also a software change to the bonder.

A principal feature of this invention lies in the use of the rerouted package so that the electrical test characteristics of the device are equal to what is already observed by the existing package. The rerouted header is a cost effective approach to producing a KGD carrier versus tooling a test carrier line. This invention utilizes already proven substrate technologies for carrying electrical signals from the die to the package lead. This invention also relies upon proven loading technology. For low volume lines, GelPac™ or other appropriate soft material which also applies temporary adhesion to the KGD and a temporary lid are used for loading. For high volume lines, a spring and lock can be used. The use of the rerouted header differentiates the DSP/KGD package option from other prior art solutions.

The DSP/KGD has the advantage of using the same package outline and pin structure as the already qualified DSP. This significantly lowers the cost of producing early life DSP product in the KGD format. The equivalent package form provides the option of using the same package for processing the KGD as is already used for the existing packaged parts. This can be leveraged to build a KGD die bank for economically providing whatever KGD product the customer requires.

There is a significant decrease in the redundancy of package qualification. The reduced requirement to qualify numerous packages means less cost of manufacturing the product and thus greater profit per KGD product. The DSP/KGD packaging option can be used for processing internally the KGD product that requires burn-in to open up the early maturity product that was before excluded from the KGD program. The low cost of producing early life KGD provides a significant advantage in KGD product over those that require test carriers or require waiting until the die is sufficiently mature for probe. The temporary carrier lines are fraught with problems on the KGD such as, for example, handling damage, contamination and poor visual quality of the product. The DSP/KGD approach solves these problems because the dice are handled in a close carrier with "Soft Handling Technology" as set forth in Ser. Nos. 09/164,580 and 09/500,519.

DESCRIPTION OF THE PREFERRED EMBODIMENT

Figure 1:
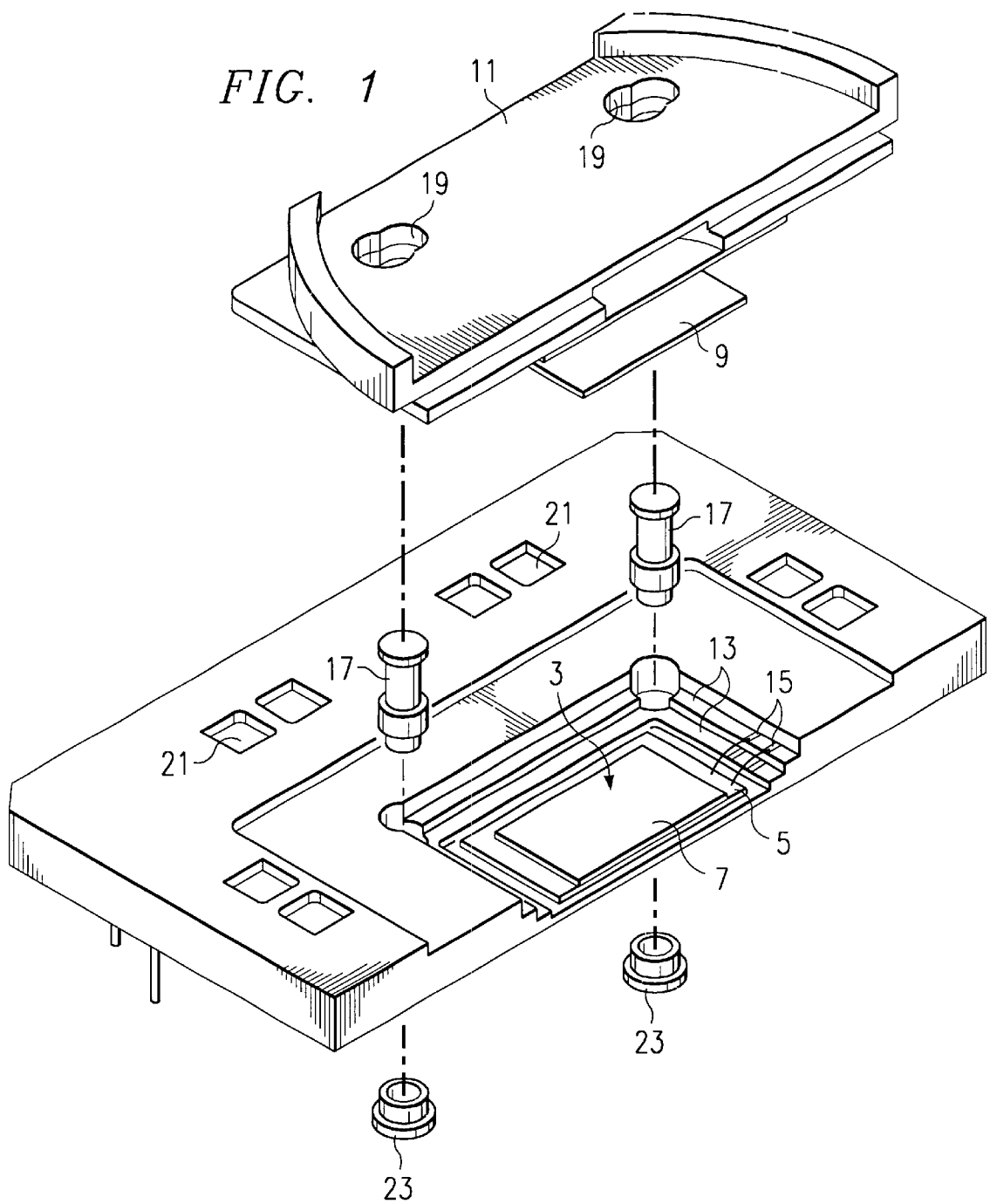
FIG. 1 is an exploded view of a cross section of a package in accordance with the present invention.
Figure 2:
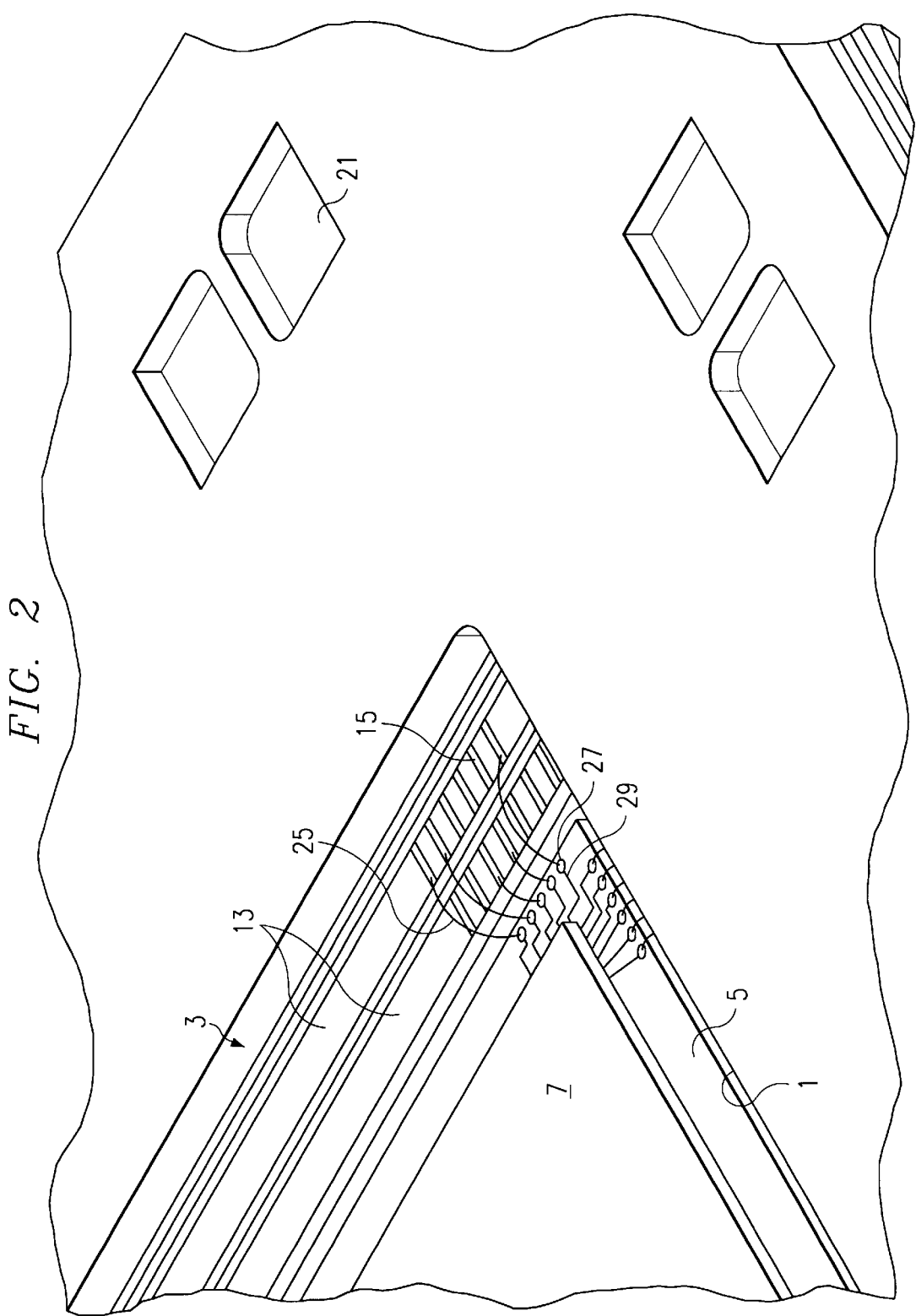
FIG. 2 is an enlarged view of a portion of the package of FIG. 1.

Referring first to FIG. 1, there is shown an exploded cross sectional view of a package in accordance with the present invention. The package includes a header 1 having a cavity 3 therein. A membrane 5, which is preferably flexible and preferably formed from a material having a coefficient of thermal expansion as close as possible to that of the substrate, is secured on the floor of the cavity 3 and includes thereon bumps and electrically conductive paths as will be explained. In the case of a silicon semiconductor device, the membrane is preferably formed of silicon. A semiconductor die 7 is disposed over the membrane 5 with bond pads thereon making contact with bumps on the membrane as will be explained. A compliant material 9 is disposed over the backside of the die 7 and lid 11 is removably secured to the header 9 to provide a force against the compliant material which in turn forces the bond pads of the die 7 against the bumps on the membrane 5 to insure proper contact between the pads and the bumps. The header 1, as better shown in FIG. 2, includes a plurality of vertically spaced lands 13, each land having a greater recess in a direction away from the cavity floor. Each land 13 includes a plurality of header bond fingers 15, the bond fingers in each land extending via conductive paths (to be explained hereinbelow) through the header, preferably to a contact location on the outer periphery of the header for contact with the outside world. Bond wires 25 connect the header bond fingers to membrane bond pads 27 on the membrane 5. A membrane interconnect 29 extends from each membrane bond pad 27 to bumps on the membrane as will be explained hereinbelow. All of the parts of the package are held together by a pair of locating posts 17 which extend through apertures 19 in the lid clamp assembly 11 and apertures 21 in the header 1 to rest in post supports 23. The assembly is locked by moving the lid clamp assembly 11 so that the locating posts 17 pass from the wide parts of the apertures 19 to the narrow parts of apertures 19 which are narrower than the heads of the locating posts.

Figure 3:
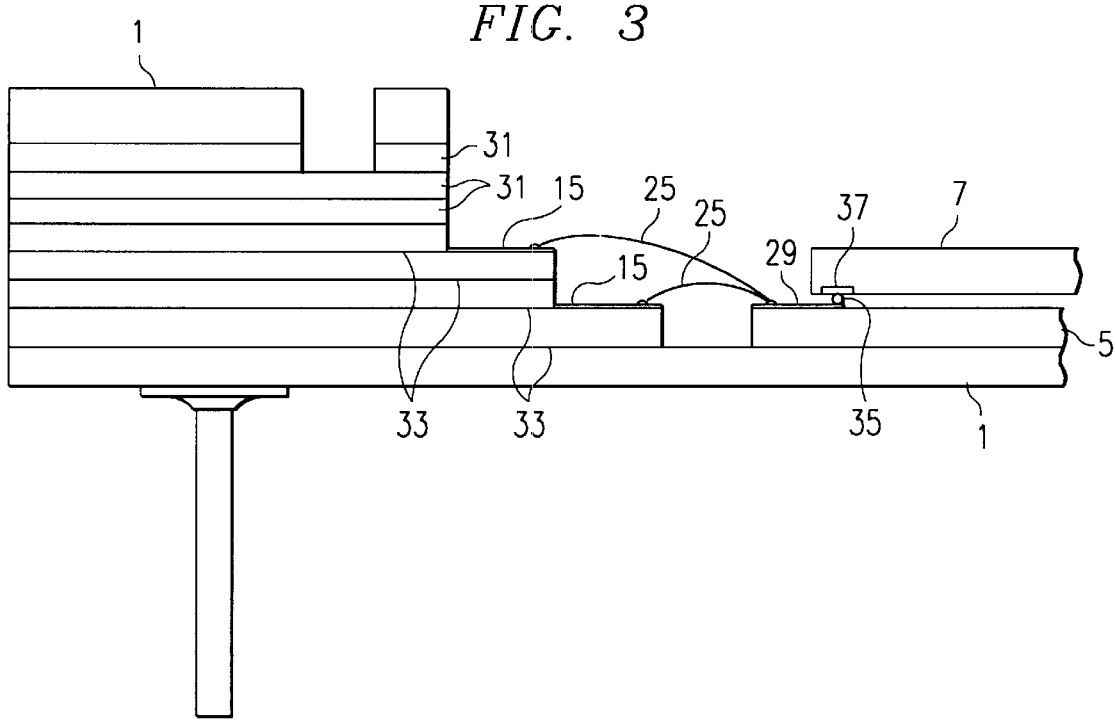
FIG. 3 is an enlarged view of the cross section of a portion of the package of FIG. 2.

Referring to FIG. 3, there is shown a portion of the header 1 which is shown to have a plurality of layers, alternate layers being electrically insulating material 31 and the other alternating layers being an electrically conductive material 33, such as, for example, copper or aluminum. Some of the electrically conductive layers 33 terminate at a header bond finger 15. Each header bond finger 15 is coupled via a bond wire 25 to a membrane interconnect 29 which is coupled to a bump 35 on the membrane 5 which, in turn, is coupled to a bond pad 37 on the die 7.

As the size of the die 7 is altered with bond pads 37 thereon occupying different locations, the arrangement of bumps 35 and membrane interconnects 29 on the membrane 5 can be adjusted so that the membrane bond pads 27 result in being in the same location with only the bumps 35 and interconnects 29 being altered. In this way, the same header can be used for a multiplicity of different dice, thereby concomitantly resulting in the ability to use the same tooling for all dice capable of using the same header finger configuration. All that must be altered is the membrane and the design thereon.

Figure 4:
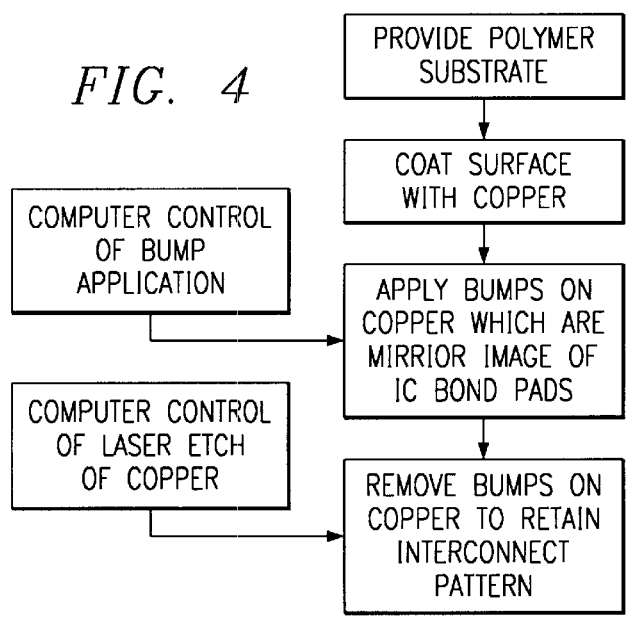
FIG. 4 is a flow chart setting forth the processing steps for fabricating of a die membrane in accordance with the second embodiment in accordance with the present invention.

In accordance with the second embodiment of the invention wherein FIG. 4 is a flow chart of the processing operations for fabrication of the membrane 5 and with reference again to FIGS. 1 and 2, after redesign of the die 7 therein, the die membrane 5 must be reworked to accommodate any repositioning of the bond pads on the die 7 with the membrane bond pads 27 retaining their original position since the header bond fingers 15 on the carrier or header 1 remain in their prior location. Accordingly, the procedure discussed above with reference to FIGS. 1 to 3 is repeated, however with an altered membrane 5.

Fabrication of the new membrane is provided by initially determining providing a substrate, such as, for example, an electrically insulating polymer onto which has been coated a layer of electrically conductive material, such as, for example, copper. The new location of bond pads on the die 7 is known and programmed into a computer which controls deposition of bumps on the copper in the mirror image of the bond pads on the die. The membrane bond pads 27 are located in the same position as in prior designs of the die so that interconnection to the header bond fingers 15 with bond wire 25 will remain unchanged with redesign. The interconnect pattern of the membrane interconnect 29 is then designed as software and fed by a computer operated by the software to a laser which removes the unwanted copper from the membrane, leaving only the desired interconnect pattern between the bond pads of the integrated circuit and the membrane bond pads 27. The die 7 is then attached to the membrane 5 with the bond pads of the integrated circuit contacting the bumps on the membrane, the die and membrane are loaded into the carrier 1 and testing and burn-in takes place as described above. Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

What is claimed is:

1. A method of packaging for a semiconductor die which comprises the steps of:

(a) providing a header having a cavity with a floor and sidewalls and a plurality of vertically spaced apart rows along the sidewalls of said cavity, each of said rows including a plurality of spaced apart bond fingers;

(b) providing a removably secured electrically insulating first membrane over the floor of said cavity, said membrane including a plurality of bumps, a plurality of peripherally located membrane bond pads and interconnect from each of said bumps to a said membrane bond pad;

(c) connecting bond wires between said membrane bond pads and said bond fingers on said plurality of rows;

(d) providing a semiconductor die having a plurality of bond pads, each of said bond pads on said semiconductor die each contacting one of said bumps on said membrane; and (e) replacing said membrane with a removably secured electrically insulating second membrane having a plurality of bumps, a plurality of peripherally located membrane bond pads and interconnect from each of said second membrane bumps to a said second membrane bond pad, at least one of said bumps and said bond pads on said second membrane being disposed in a position different from said first membrane.

2. The method of claim 1 wherein said membrane is at least one of silicon, polyimide or ceramic material.

3. The method of claim 2 wherein said header includes a plurality of alternating layers of electrically conducting material and electrically insulating material, said bond fingers on said header each coupled to one of said layers of electrically conducting material.

4. The method of claim 3 wherein each of said layers of electrically conducting material includes a plurality of spaced apart interconnect lines, each of said lines coupled to one of said bond fingers.

5. The method of claim 4 further including an electrical conductor interconnecting said electrically conducting material on spaced apart layers of said header.

6. The method of claim 1 wherein said header includes a plurality of alternating layers of electrically conducting material and electrically insulating material, said bond fingers on said header each coupled to one of said layers of electrically conducting material.

7. The method of claim 6 wherein each of said layers of electrically conducting material includes a plurality of spaced apart interconnect lines, each of said lines coupled to one of said bond fingers.

8. The method of claim 7 further including an electrical conductor interconnecting said electrically conducting material on spaced apart layers of said header.

9. The method of claim 6 further including an electrical conductor interconnecting said electrically conducting material on spaced apart layers of said header.

10. The method of claim 1 wherein said electrically insulating membrane is a removable membrane, further including the steps of removing said membrane, said bond wires and said die from said cavity and replacing said membrane with a different membrane having bumps and bond pads located differently from the locations in the removed membrane.

11. The method of claim 1 further comprising the steps of forming said membrane by providing a solid electrically conducting film insulated from a criss-cross electrically conductive pattern and then etching said solid electrically conducting film and said pattern to provide a desired interconnect configuration on said membrane.

12. The method of claim 1 wherein said interconnect is formed from at least one of aluminum, gold, silver or copper.

* * * * *